United States Patent [19]
Yen et al.

[11] Patent Number: 5,510,296
[45] Date of Patent: Apr. 23, 1996

[54] MANUFACTURABLE PROCESS FOR TUNGSTEN POLYCIDE CONTACTS USING AMORPHOUS SILICON

[75] Inventors: Haw Yen, Hsin Chu; Shaw-Tseng Hsia, Taipei, both of Taiwan

[73] Assignee: Vanguard International Semiconductor Corporation, Hsinchu, Taiwan

[21] Appl. No.: 429,727

[22] Filed: Apr. 27, 1995

[51] Int. Cl.⁶ .................................................. H01L 21/28
[52] U.S. Cl. ............................ 437/200; 437/46; 437/193
[58] Field of Search ............................ 437/46, 193, 195, 437/200

[56] References Cited

U.S. PATENT DOCUMENTS

| | | | |
|---|---|---|---|
| 4,800,176 | 1/1989 | Kakumu et al. | 437/193 |
| 4,968,645 | 11/1990 | Baldi et al. | 437/193 |
| 5,340,761 | 8/1994 | Loh et al. | 437/193 |
| 5,366,929 | 11/1994 | Cleeves et al. | 437/195 |
| 5,371,041 | 12/1994 | Liou et al. | 437/192 |
| 5,374,591 | 12/1994 | Hasegawa et al. | 437/187 |

*Primary Examiner*—George Fourson
*Assistant Examiner*—Thomas G. Bilodeau
*Attorney, Agent, or Firm*—George O. Saile

[57] ABSTRACT

A method for creating manufacturable polycide contacts, for use in advanced semiconductor designs using images as small as 0.35 µM, has been developed. An amorphous silicon film, is used as an underlay, to assist in the growth of an overlying tungsten silicide layer. The tungsten silicide deposition is performed using tungsten hexafluoride and silane, and in conjunction with the amorphous silicon underlay, results excellent step coverage in the narrow contact hole. A nitrogen anneal, using high flow rates, optimizes the adhesion characteristics of the tungsten polycide structure.

22 Claims, 5 Drawing Sheets

MANUFACTURABLE PROCESS FOR TUNGSTEN POLYCIDE CONTACTS USING AMORPHOUS SILICON

BACKGROUND OF THE INVENTION (1) Field of the Invention

The present invention relates to a fabrication method used for semiconductor devices, and more specifically to an improved process for polycide coating of contact holes in a dielectric layer.

(2) Description of Prior Art

The trend in the semiconductor industry to smaller, higher performance silicon devices, has been influenced by the ability of specific semiconductor disciplines to achieve micro-miniaturazation. Advances in photolithography, via more sophisticated exposure cameras, as well as development of more sensitive photoresist materials, have, allowed sub-micron images in photoresist materials to be routinely achieved. Comparable breakthroughs in the dry etching technology have allowed the sub-micron images in photoresist to be successfully transferred to underlying semiconductor materials via anisotropic reactive ion etching, (RIE), procedures. Other semiconductor fabrication disciplines, such as low pressure chemical vapor deposition, (LPCVD), and ion implantation, (I/I), have also contributed to the attainment of smaller, higher performing silicon devices.

However with the use of sub-micron feature, for specific elements of a semiconductor device, specific vulnerabilities, in terms of yield and reliability, arise. For example a device feature, needed to be reduced to successfully achieve micro-miniaturazation, is the contact or via hole, used to electrically connect; either two levels of wiring, or an active device region in silicon to an overlying wiring level. With the trend to sub-micron images, contact holes with diameters as small as 0.35 µM have been used. The decreased contact hole diameter, although successful in allowing for the fabrication of smaller silicon chips, has put special demands on the properties of the materials used to fill these small openings. First the material has to inherently possess excellent current carrying capabilities. The excellent electromigration resistance of refractory metals, such as tungsten, and also silicides such as tungsten silicide, has made these materials leading candidates for contact hole filling. An area of concern is the inability of the refractory or silicide, to completely fill the contact, that is the filling process supply adequate step coverage. This becomes more imperative as the contact hole diameter decreases. A solution to the filling criteria is offered by Cleeves, et al, in U.S. Pat. No. 5,366, 929, in which a selective fill is described using a sputter etch clean followed by a selective deposition. This solution although presenting possiblities of optimum fills, is complex and costly. Another area of concern with the use of refractory or silicide fills is the ability to achieve adhesion between the fill material and the contact hole materials. Many solutions have been offered, such as the use of titanium or titanium nitride films as adhesion layers, used to coat the contact hole prior to the fill deposition. Hasegawa, et al, in U.S. Pat. No. 5,374,591, offer a titanium nitride adhesion layer, followed by an etch back of the titanium nitride, at the edges of the contact, again directed at improving the subsequent fill process. Again, however this process is complex and costly. The fabrication process now described in this invention will offer an improved adhesion layer., as well as an optimized fill method enabling simple, reliable and non-costly contacts to be used.

SUMMARY OF THE INVENTION

It is an object of this invention to provide an optimized process for coating narrow diameter contact holes with conductive materials.

It is another object of this invention to use an underlying adhesion layer of amorphous silicon, prior to coating the narrow contact hole with a conductive material.

It is yet another object of this invention to coat the contact hole with tungsten silicide, obtained using silane as one of the reactants.

It is still yet another object of this invention to anneal the polycide filled contact hole, using a high flow of nitrogen.

In accordance with this present invention a method is described for fabricating semiconductor devices, using small diameter contact holes or vias to interconnect specific levels, in which the contacts or vias are partially filled with a polycide material obtained using an optimized fill process. A small diameter contact hole is provided in a dielectric layer, to active device regions in a semiconductor substrate. After a surface clean, in a dilute hydrofluoric acid solution, a thin layer of amorphous silicon is deposited. An ion implantation process is used to dope the amorphous silicon layer, again followed by a dilute hydrofluoric acid surface clean. A deposition of tungsten silicide, partially filling the small diameter contact hole, is next performed, creating the tungsten polycide, the tungsten silicide - amorphous silicon composite. After patterning of the polycide to obtain the desired image, via RIE procedures, an anneal using a high flow of nitrogen is performed to improve the contact resistance of the polycide to the underlying regions.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

The method of fabricating MOSFETs using the optimized polycide contact process will now be covered in detail. The optimized polycide contact process can be used as part of MOSFET devices that are currently being manufactured in industry, therefore only the specific areas unique to understanding this invention will be described in detail.

Figure 1:
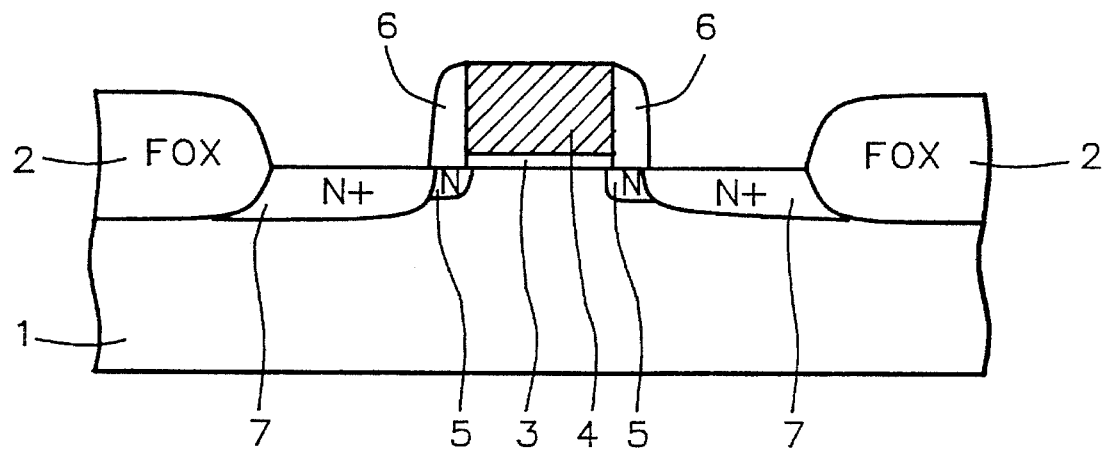
FIG. 1, which schematically illustrates, in cross-sectional style, a metal oxide semiconductor field effect transistor, (MOSFET), device, prior to the initiation of the optimized polycide contact process.

FIG. 1 shows a typical NFET, (N type field effect transistor), to which the optimized polycide contact process will be used with. A substrate, 1, composed of P type, single crystal silicon, with a <100> orientation, is used. A thick field oxide region, 2, (FOX), is formed surrounding the region where the device is to be built. Briefly the method used to create the FOX isolation region is to use an oxidation mask of silicon nitride, overlaying a thin thermal silicon dioxide layer. The desired FOX region is etched open in the composite dielectric, while leaving the subsequent device region protected, using conventional photolithographic and dry etching procedures. After removal of the masking photoresist, and a wet chemical clean, a field oxide is thermally grown, typically to a thickness between about 4000 to 6000 Angstroms. After removal of the oxidation mask, using a hot phosphoric acid solution, for the silicon nitride layer, and a buffered hydrofluoric acid solution for the underlying silicon dioxide layer, a gate oxide, 3, is grr, wn at a temperature between about 850° to 950° C., to a thickness between about 70 to 250 Angstroms. Next a polysilicon layer, 4, is deposited, using LPCVD processing, at a temperature between about 550° to 750° C., to a thickness between about 2000 to 4000 Angstroms. An ion implantation procedure is then used to dope polysilicon layer, 4, using phosphorous, at an energy between about 50 to 100 Kev., at a dose between about 1E13 to 5E14 atoms/cm2. Standard photolithographic, and reactive ion etching, (RIE), processing, using SF6 as an etchant, are next used to create the polysilicon gate structure, 4, shown in FIG. 1.

The MOSFET fabrication process continues by photoresist removal, followed by careful wet chemical cleans. An N type, lightly doped source and drain region, 5, is then created in the semiconductor substrate via ion implantation of phoshorous, at an energy between about 50 to 100 Kev., at a dose between about 1E13 to 5E13 atoms/cm2. A silicon oxide layer is next produced via LPCVD processing, using tetraethylorthosilicate as a source, at a temperature between about 650° to 750° C., to a thickness between about 2000 to 4000 Angstroms. A selective anisotropic RIE procedure is then employed, using CHF3, to form the oxide sidewall spacer, 6. The N+ source and drain regions 7, are now created via ion implantation of arsenic, at an energy between about 75 to 150 Kev., at a dose between 1E15 to 5E15 atoms/cm2, followed by an activation cycle using either conventional furnace procedures, at a temperature between 850° to 950° C., for a time of between about 10 to 30 min., or via rapid thermal annealing., (RTA), again at a temperature between about 850° to 950° C., but for a time between about 10 to 60 sec.

Figure 2:
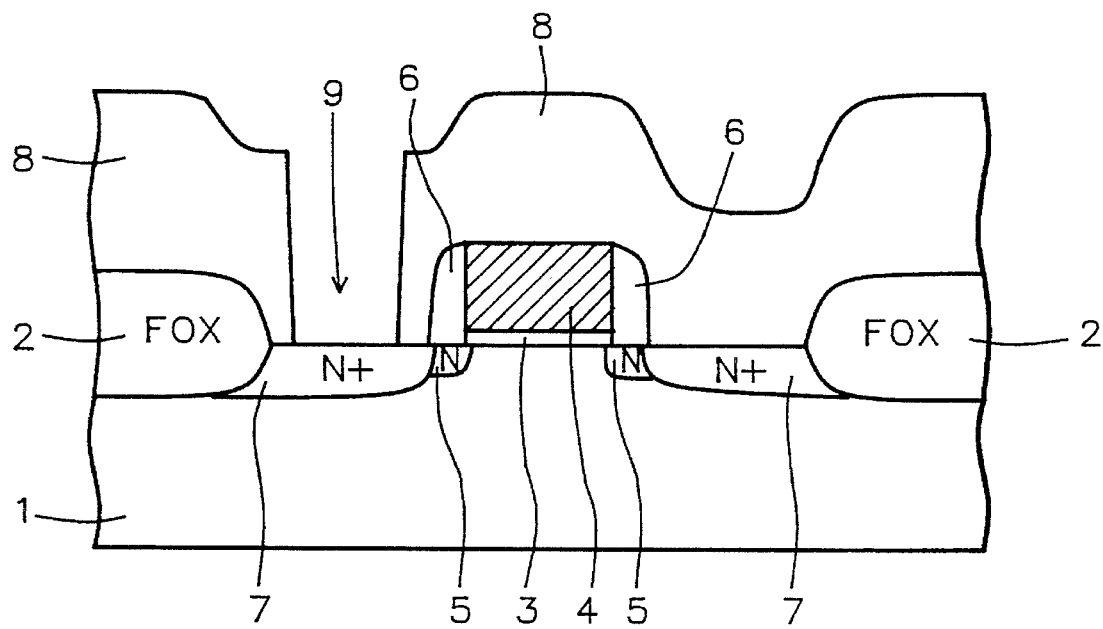
FIGS. 2–6, which schematically illustrate, in cross-sectional style, the specific fabrication stages for the optimized polycide contact process.
Figure 3:
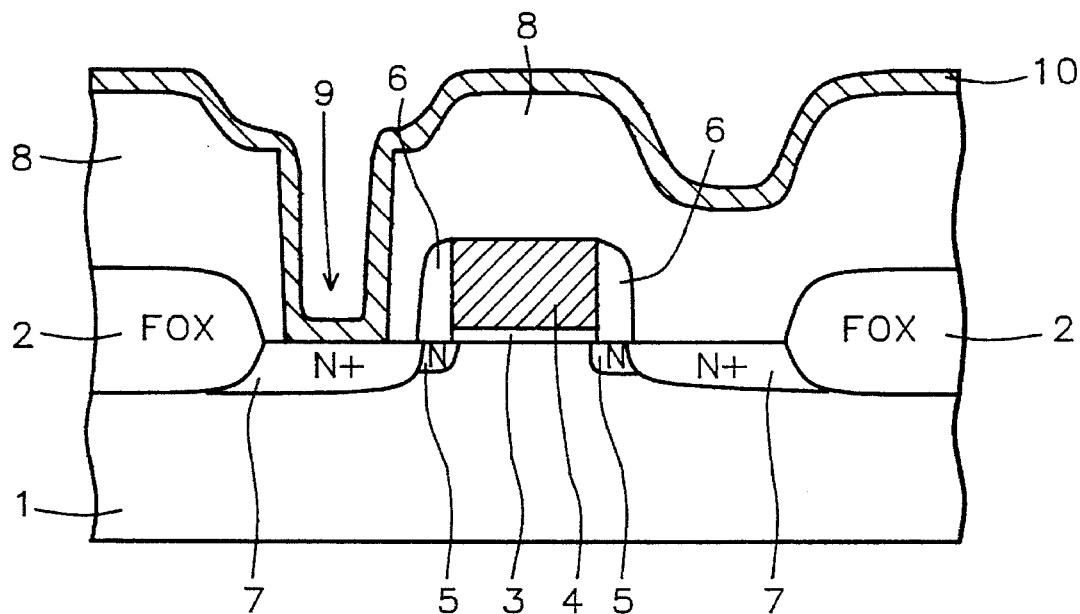

A silicon oxide layer, 8, is formed on the MOSFET structure, using LPCVD processing at a temperature between about 400° to 600° C., to a thickness between about 3000 to 4000 Angstroms. Photolithographic and RIE procedures, using CHF3, or CF4, are used to create contact hole, 9, in silicon oxide layer, 8, exposing source and drain region, 7, in the semiconductor substrate. This is shown schematically in FIG. 2. After photoresist removal, followed by careful organic cleans, the structure is subjected to a 200:1 by weight, dilute hydrofluoric, (DHF), acid solution, at a temperature between about 20° to 25° C., for a time between about 60 to 120 sec, for purposes of removing any native oxide from the surface of the N+ source and drain region, 7. A deposition of amorphous silicon, 10, shown in FIG. 3, is then performed, using LPCVD processing at a temperature between about 500° to 550° C., to a thickness between about 300 to 700 Angstroms, and preferably 500 Angstroms. The use of amorphous silicon as an underlay, or adhesion layer for a subsequent overlying silicide layer, rather then polycrystalline grained silicon, is based on the ability of the amorphous seed layer to assist in the growth of the overlying tungsten silicide, to a higher degree then counterparts fabricated with polycrystalline underlying seed layers. The thin amorphous silicon layer, 10, is then subjected to an ion implantation step, using phosphorous at an energy between about 30 to 40 Kev., at dose between about 1E15 to 5E15 atoms/c2.

Figure 4:
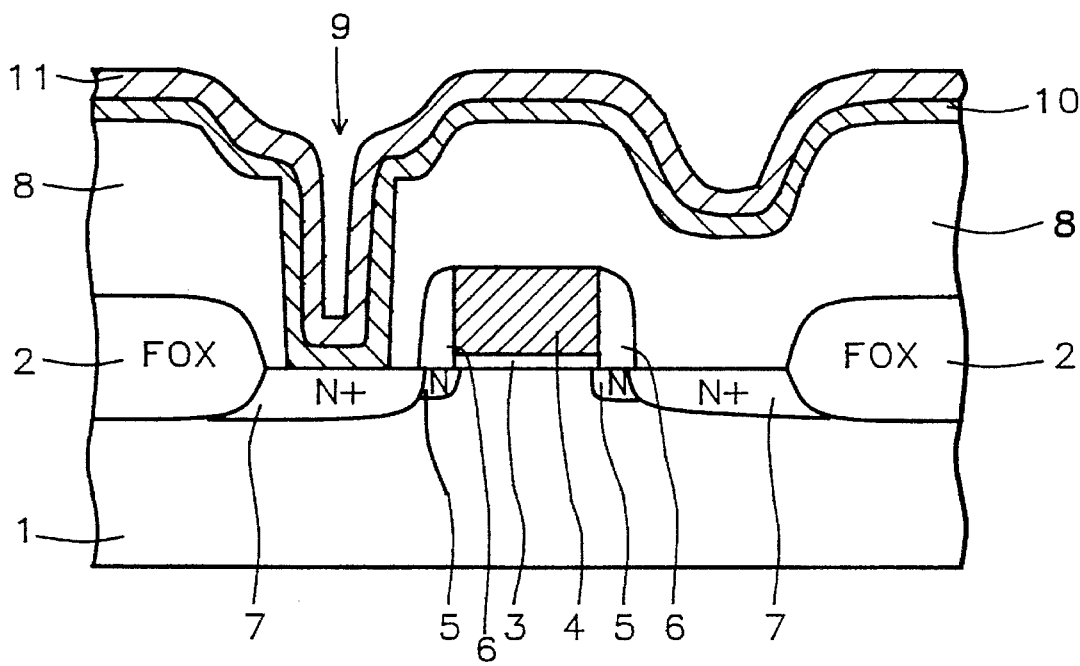

A pre-clean, again using DHF, at a temperature between about 20° to 25° C., for a time between 60 to 120 sec., is used to remove any native oxide from the amorphous silicon layer, 10. An LPCVD process, using tungsten hexafluoride and silane., at a temperature between about 300° to 400° C., is used to deposit a layer of tungsten silicide 11, shown in FIG. 4, to a thickness between about 1000 to 2000 Angstroms, and preferably 1500 Angstroms. It is critical that the deposition conditions result in excellent step coverage, partially filling contact hole, 9. The use of these deposition conditions, in addition to the use of an amorphous silicon underlay, allowed the above requirements to be met.

Figure 5:
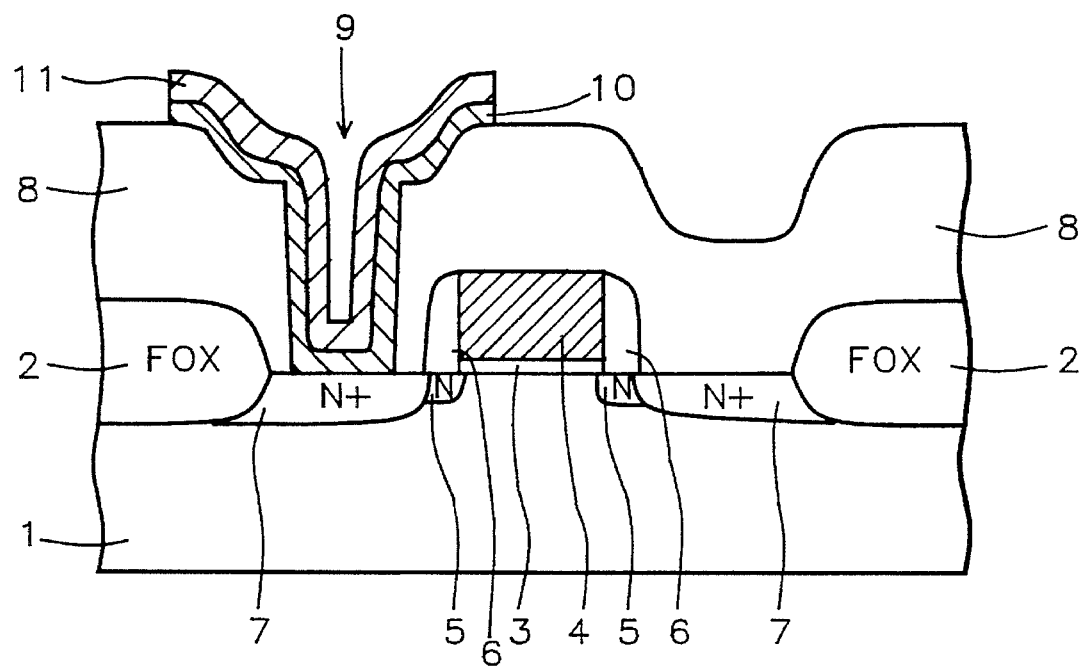

The tungsten silicide—amorphous silicon composite, referred to as the tungsten polycide, can be used as either a contact metallurgy, or as both a contact and interconnect metallization. If the latter is desired the patterning of the tungsten polycide is accomplished using standard photolithographic and RIE procedures. The selective RIE process is carried out using SF6, to etch the tungsten polycide and stop on the underlying oxide layer, 8. After photoresist removal the resulting contact—interconnect metallization is shown schematically in FIG. 5. A critical anneal is now performed in an nitrogen ambient at a temperature between about 750° to 850° C., and preferably 800° C., for a time between about 30 to 60 min. The anneal step is performed using a high nitrogen flow between about 25 to 30 slm, and preferably 28 slm, which is critical in not allowing deleterious oxidation formation to occur at tungsten silicide — amorphous Si interface. These conditions, amorphous silicon underlay, tungsten silicide deposition using silane, and a nitrogen anneal at high flow rates, have allowed this process to be successfully used for contact hole diameters as small as 0.35 uM.

Figure 6:
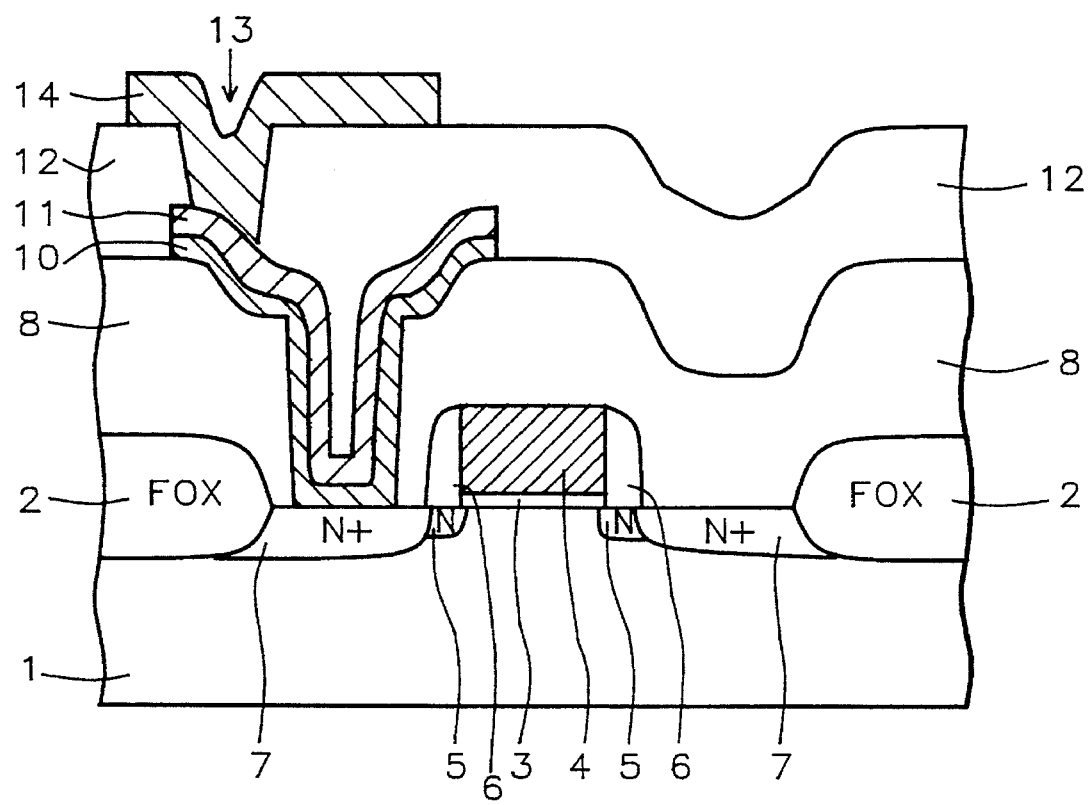

FIG. 6 describes the completion of the MOSFET structure fabricated using the optimized tungsten polycide contact process. An oxide layer 12, is deposited to a thickness between about 5000 to 10000 Angstroms. Conventional photolithographic and RIE procedures are used to open via, 13, in oxide layer, 12, to the tungsten polycide contact metallization. After photoresist removal, and careful wet chemical cleans, a deposition of Al—Cu is performed to a thickness between 8000 to 12000 Angstroms. Again standard photolithographic and dry etching is employed to create metal interconnect, 14.

Figure 7:
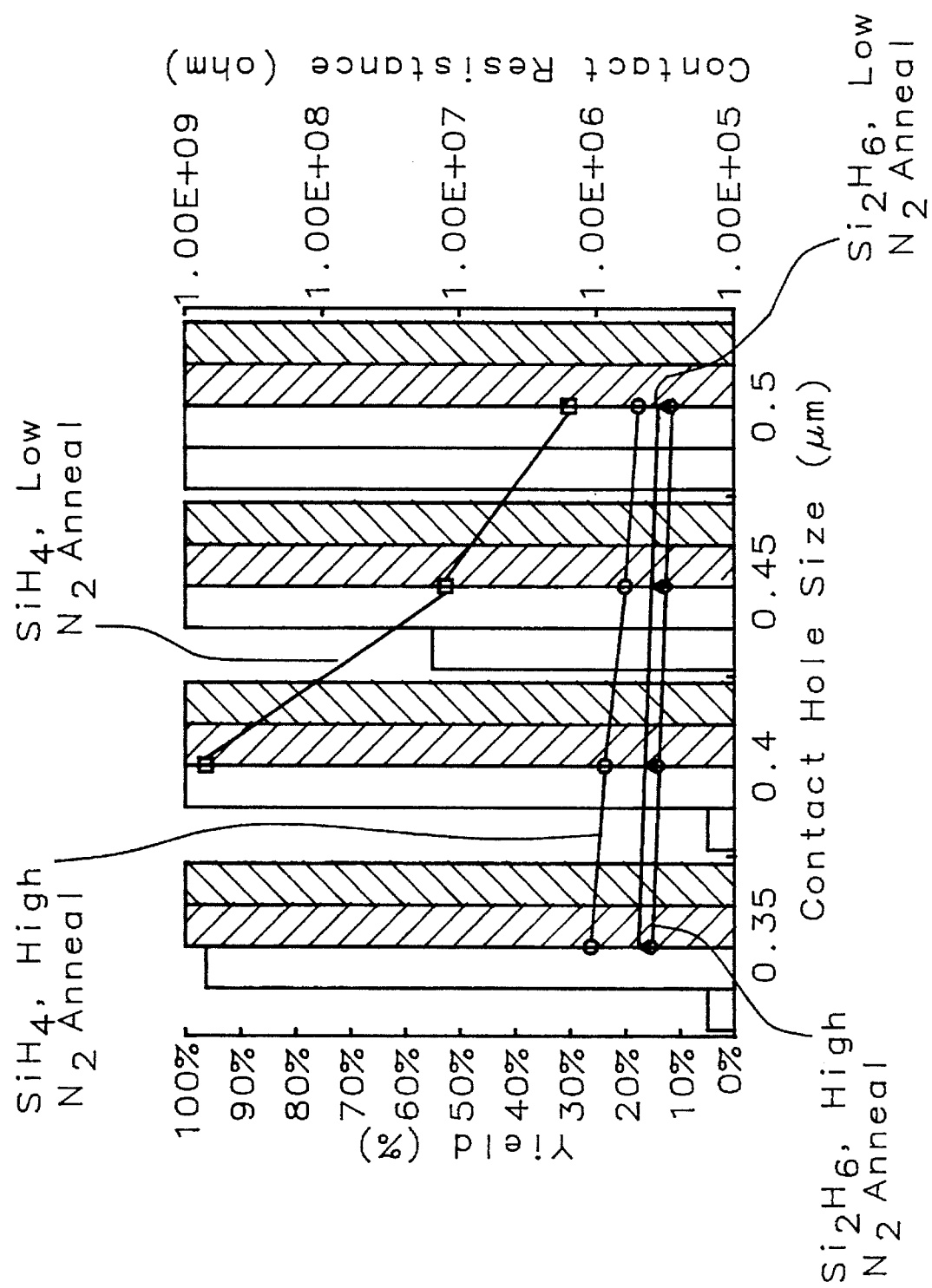
FIGS. 7–8, which in bar graph representation, illustrates the improvement in specific device paramaters obtained via the use of the optimized polycide contact process.
Figure 8:
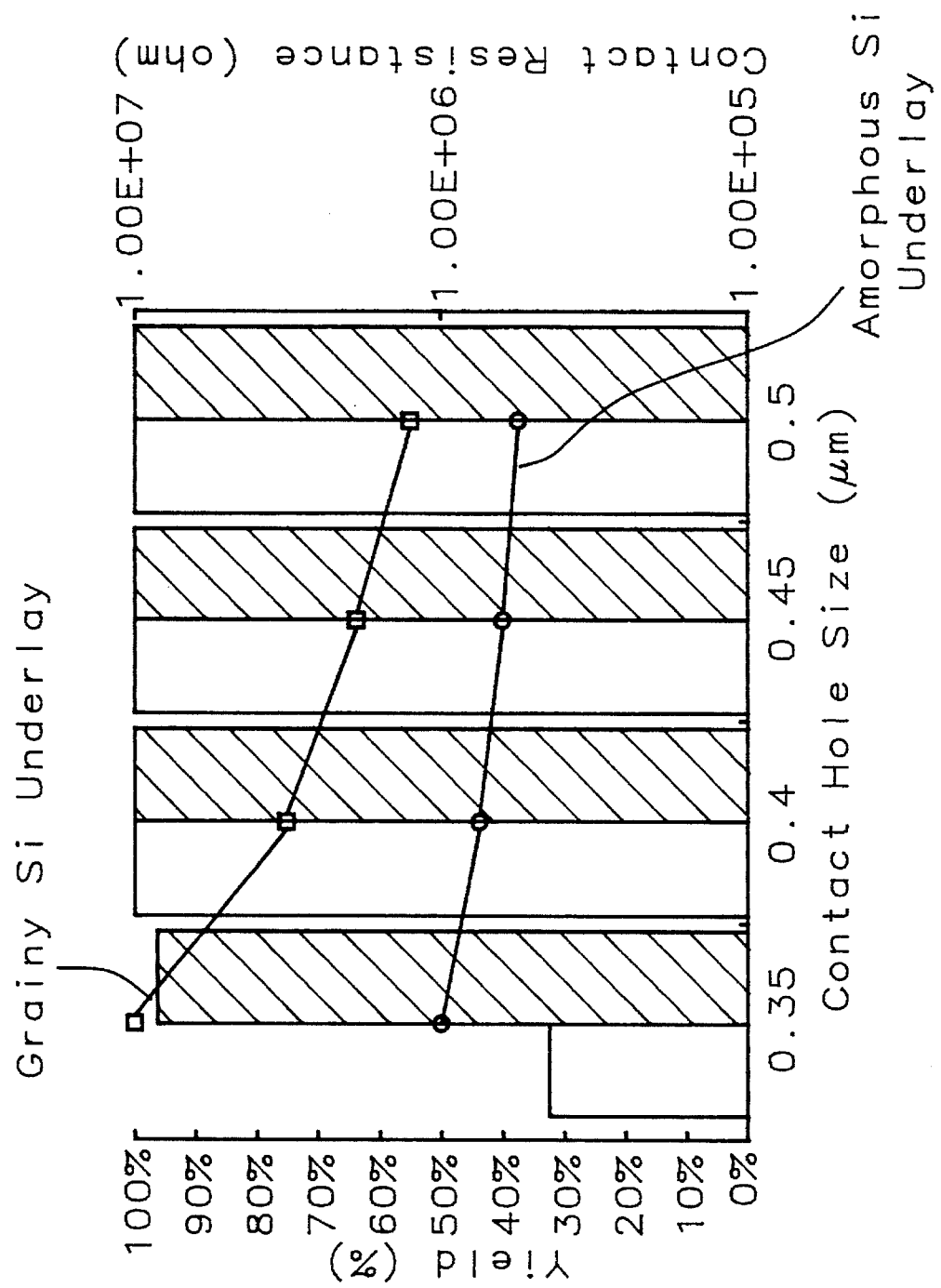

Finally FIGS. 7–8, indicate the benefits of this invention. It can be seen in FIG. 7 that the tungsten silicide yield is dramatically improved, specifically for the smallest contact hole size, via the use of annealing in a high N2 flow. It can also be observed that the resistance in the contact is minimized as a result of an anneal using a high N2 flow. FIG. 8, shows the highest yield and lowest contact resistance resulting via the use of amorphous silicon underlays, as compared to counterparts fabricated using grainy silicon underlays.

This invention, an optimized, manufacturable tungsten polycide contact metallization, although shown as a part of an N type, (NFET), MOSFET device, can also be applied to P type, (PFET), MOSFET devices, and complimentary, (CMOS), and BiCMOS structures.

While this invention has been particularly shown and described with reference to, the preferred embodiments thereof, it will be understood by those skilled in the art that various changes in form and details may be made without departing from the spirit and scope of this invention.

What is claimed is:

1. A method for fabricating a MOSFET device on a semiconductor substrate, using a polycide coated hole to provide electrical contact between active device regions in the substrate, and the interconnect metallizations, comprising the steps of:

provide the active device elements in said semiconductor substrate;

depositing a first dielectric layer on said semiconductor substrate, that includes said active device elements;

photolithe, graphic processing to open a region in photoresist, exposing said first dielectric layer, directly overlying said active device element;

anisotropic removal of said first dielectric layer, in said opened region of photoresist, to create a contact hole to said active device element;

surface cleaning of said active device element, in said contact hole opening;

depositing a layer of amorphous silicon on said active device element, in said contact hole opening, and on the surface of said first dielectric layer;

ion implanting a first conductivity imparting dopant into said silicon layer;

surface cleaning of said silicon layer;

depositing a metal silicide layer on said silicon layer, to form a metal polycide;

patterning of said metal polycide to form contact structure; and annealing of said metal polycide contact structure.

2. The method of claim 1, wherein said active device element in said semiconductor substrate, is an N type doped region.

3. The method of claim 1, wherein said first dielectric layer is silicon oxide, deposited using LPCVD, at a temperature between about 400° to 600° C., to a thickness between about 3000 and 4000 to Angstroms.

4. The method of claim 1, wherein the surface of said active device element, in said contact hole opening, is cleaned using a solution of 200 parts by weight water, to 1 part by weight hydrofluoric acid, at a temperature between about 20° and 25° C., for a time between about 60 and 120 seconds.

5. The method of claim 1, wherein said silicon layer is amorphous silicon, obtained using LPCVD processing at a temperature between about 500° and 550° C., to a thickness between about 300 and 700 Angstroms.

6. The method of claim 1, wherein said first conductivity imparting dopant is phosphorous, implanted at an energy between about 30 and 40 Kev, at a dose between about 1E15 and 5E15 atoms/cm2.

7. The method of claim 1, wherein the surface of said amorphous silicon is cleaned using a solution of 200 parts by weight water, to 1 part hydrofluoric acid, at a temperature between about 20° and 25° C., for a time between about 60 and 120 seconds.

8. The method of claim 1, wherein said metal silicide is tungsten silicide, obtained via LPCVD processing, using silane and tungsten hexafluoride, at a temperature between about 300° and 400° C., to a thickness between about 1000 and 2000 Angstroms.

9. The method of claim 1, wherein said metal polycide structure is formed using RIE patterning.

10. The method of claim 1, wherein said metal polycide contact structure is formed using chemical mechanical polishing.

11. The method of claim 1, wherein said metal polycide structure is annealed in nitrogen, at a temperature between about 750° and 850° C., for a time between about 30 and 60 minutes at a nitrogen flow between about 25 to 30 standard liters per minute, (slm).

12. A method for fabricating a MOSFET device or, a semiconductor substrate, using a tungsten polycide coated contact hole to provide electrical contact between source and drain regions in the substrate, and interconnect metallizations, comprising the steps of:

providing source and drain regions in said semiconductor substrate;

depositing a first dielectric layer on said semiconductor substrate, that includes exposed said source and drain regions;

photolithographic processing to open a region in photoresist, exposing said first dielectric layer, directly overlying said source and drain region;

anisotropic removal of said first dielectric layer, in said opened region of photoresist, to create a contact hole to said source and drain region;

surface cleaning of said source and drain region, in said contact hole opening;

depositing a layer of amorphous silicon on said source and drain region, in said contact hole opening, and on surface of said first dielectric layer;

ion implanting a first conductivity imparting dopant into said amorphous silicon layer;

surface cleaning of said amorphous silicon layer;

depositing a tungsten silicide layer on said amorphous silicon layer, to form tungsten polycide;

patterning of said tungsten polycide to form contact structure; and annealing of said tungsten polycide contact structure.

13. The method of claim 12, wherein said source and drain region in said semiconductor substrate, is an N type doped region.

14. The method of claim 12, wherein said first dielectric layer is silicon oxide, deposited using LPCVD processing, at a temperature between about 400° and 600° C., to a thickness between about 3000 and 4000 Angstroms.

15. The method of claim 12, wherein surface of said source and drain region, in said contact hole, is cleaned using a solution of 200 parts by weight water to 1 part by weight hydrofluoric acid, at a temperature between about 20° and 25° C., for a time between about 60 and 120 sec.

16. The method of claim 12, wherein said amorphous silicon layer is deposited using LPCVD, at a temperature between about 500° and 550° C., to a thickness between about 300 and 700 Angstroms.

17. The method of claim 12, wherein said first conductivity imparting dopant is phosphorous, implanted at an energy between about 30 and 40 Kev, at a dose between about 1E15 and 5E15 atoms/cm2.

18. The method of claim 12, wherein surface of said amorphous silicon layer is cleaned using a solution of 200 parts by weight water, to 1 part by weight hydrofluoric acid, at a temperature between about 20° and 25° C., for a time between about 60 and 120 seconds.

19. The method of claim 12., wherein said tungsten silicide layer is formed by LPCVD processing, using silane and tungsten hexafluoride, at a temperature between about 300° and 400 ° C., to a thickness between about 1000 and 2000 Angstroms.

20. The method of claim 12, wherein said tungsten polycide structure is formed by RIE patterning.

21. The method of claim 18, wherein said tungsten polycide contact structure is formed using chemical mechanical polishing.

22. The method of claim 12, wherein said tungsten polycide structure is annealed in nitrogen, at a temperature between about 750° and 850° C., for a time between about 30 and 60 minutes, at a nitrogen flow between about 25 and 30 slm.

\* \* \* \* \*